United States Patent
Chen et al.

(10) Patent No.: US 9,330,695 B1
(45) Date of Patent: May 3, 2016

(54) DISK DRIVE HEAD SUSPENSION TAIL WITH A NOBLE METAL LAYER DISPOSED ON A PLURALITY OF STRUCTURAL BACKING ISLANDS

(71) Applicant: Western Digital Technologies, Inc., Irvine, CA (US)

(72) Inventors: Yih-Jen Dennis Chen, Pleasanton, CA (US); Yanning Liu, San Ramon, CA (US); Kia Moh Teo, San Jose, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 14/670,374

(22) Filed: Mar. 26, 2015

Related U.S. Application Data

(63) Continuation-in-part of application No. 14/322,616, filed on Jul. 2, 2014, which is a continuation-in-part of application No. 14/209,909, filed on Mar. 13, 2014, now Pat. No. 9,165,580.

(60) Provisional application No. 61/914,315, filed on Dec. 10, 2013.

(51) Int. Cl.
*G11B 5/48* (2006.01)

(52) U.S. Cl.
CPC ............... *G11B 5/48* (2013.01); *G11B 5/4846* (2013.01); *G11B 5/4853* (2013.01)

(58) Field of Classification Search
USPC .......................................... 360/244.7, 245.4
See application file for complete search history.

(56) References Cited

U.S. PATENT DOCUMENTS

| | | |
|---|---|---|
| 4,714,435 A | 12/1987 | Stipanuk et al. |
| 5,103,356 A | 4/1992 | Fujiwara et al. |
| 5,103,359 A | 4/1992 | Marazzo |
| 5,235,482 A | 8/1993 | Schmitz |
| 5,348,488 A | 9/1994 | Green et al. |
| 5,415,555 A | 5/1995 | Sobhani |
| 5,422,764 A | 6/1995 | McIlvanie |
| 5,465,186 A | 11/1995 | Bajorek et al. |
| 5,612,841 A | 3/1997 | Johnson |
| 5,631,786 A | 5/1997 | Erpelding |
| 5,668,684 A | 9/1997 | Palmer et al. |
| 5,827,084 A | 10/1998 | Biernath |
| 5,861,661 A | 1/1999 | Tang et al. |
| 5,903,056 A | 5/1999 | Canning et al. |
| 5,903,413 A | 5/1999 | Brooks, Jr. et al. |
| 5,920,465 A | 7/1999 | Tanaka |

(Continued)

OTHER PUBLICATIONS

US 7,337,529, 8/2014, Bennin, et al. (withdrawn).

(Continued)

*Primary Examiner* — Carlos E Garcia

(57) ABSTRACT

A head suspension assembly for a disk drive includes a load beam and a laminated flexure that comprises a stainless steel layer, a copper trace layer, and a dielectric layer between the stainless steel layer and the copper trace layer. The laminated flexure includes a flexure tail that extends away from the load beam to a flexure tail terminal region. The copper trace layer includes a plurality of flexure bond pads in the flexure tail terminal region. The stainless steel layer includes a plurality of backing islands in the flexure tail terminal region. Each of the plurality of backing islands is aligned with a corresponding one of the plurality of flexure bond pads. A noble metal layer is disposed on the plurality of backing islands.

13 Claims, 5 Drawing Sheets

(56) References Cited

U.S. PATENT DOCUMENTS

| | | | |
|---|---|---|---|
| 5,947,750 | A | 9/1999 | Alcoe et al. |
| 6,007,669 | A | 12/1999 | Crumly et al. |
| 6,036,813 | A | 3/2000 | Schulz et al. |
| 6,046,889 | A | 4/2000 | Berding et al. |
| 6,052,890 | A | 4/2000 | Malagrino, Jr. et al. |
| 6,061,206 | A | 5/2000 | Foisy et al. |
| 6,076,256 | A | 6/2000 | Drake et al. |
| 6,101,876 | A | 8/2000 | Brooks et al. |
| 6,134,770 | A | 10/2000 | Heeren et al. |
| 6,145,188 | A | 11/2000 | Brooks, Jr. et al. |
| 6,147,831 | A | 11/2000 | Kennedy et al. |
| 6,151,189 | A | 11/2000 | Brooks |
| 6,151,197 | A | 11/2000 | Larson et al. |
| 6,185,067 | B1 | 2/2001 | Chamberlain |
| 6,185,074 | B1 | 2/2001 | Wang et al. |
| 6,185,075 | B1 | 2/2001 | Tsujino et al. |
| 6,208,486 | B1 | 3/2001 | Gustafson et al. |
| 6,212,046 | B1 | 4/2001 | Albrecht et al. |
| 6,215,616 | B1 | 4/2001 | Phan et al. |
| 6,228,689 | B1 | 5/2001 | Liu |
| 6,272,694 | B1 | 8/2001 | Weaver et al. |
| 6,288,866 | B1 | 9/2001 | Butler et al. |
| 6,292,333 | B1 | 9/2001 | Blumentritt et al. |
| 6,344,950 | B1 | 2/2002 | Watson et al. |
| 6,349,464 | B1 | 2/2002 | Codilian et al. |
| 6,351,352 | B1 | 2/2002 | Khan et al. |
| 6,360,426 | B1 | 3/2002 | Summers et al. |
| 6,367,144 | B1 | 4/2002 | Holaway et al. |
| 6,381,099 | B1 | 4/2002 | Mei |
| 6,382,499 | B1 | 5/2002 | Satoh et al. |
| 6,386,434 | B1 | 5/2002 | Wong |
| 6,388,873 | B1 | 5/2002 | Brooks et al. |
| 6,399,889 | B1 | 6/2002 | Korkowski et al. |
| 6,417,979 | B1 | 7/2002 | Patton, III et al. |
| 6,421,208 | B1 | 7/2002 | Oveyssi |
| 6,441,998 | B1 | 8/2002 | Abrahamson |
| 6,462,914 | B1 | 10/2002 | Oveyssi et al. |
| 6,466,398 | B1 | 10/2002 | Butler et al. |
| 6,469,871 | B1 | 10/2002 | Wang |
| 6,502,300 | B1 | 1/2003 | Casey et al. |
| 6,519,116 | B1 | 2/2003 | Lin et al. |
| 6,529,345 | B1 | 3/2003 | Butler et al. |
| 6,529,350 | B1 | 3/2003 | Itoh |
| 6,529,351 | B1 | 3/2003 | Oveyssi et al. |
| 6,535,358 | B1 | 3/2003 | Hauert et al. |
| 6,545,382 | B1 | 4/2003 | Bennett |
| 6,549,381 | B1 | 4/2003 | Watson |
| 6,560,065 | B1 | 5/2003 | Yang et al. |
| 6,571,460 | B1 | 6/2003 | Casey et al. |
| 6,574,073 | B1 | 6/2003 | Hauert et al. |
| 6,580,574 | B1 | 6/2003 | Codilian |
| 6,594,111 | B1 | 7/2003 | Oveyssi et al. |
| 6,603,620 | B1 | 8/2003 | Berding |
| 6,614,623 | B2 | 9/2003 | Nakamura et al. |
| 6,618,222 | B1 | 9/2003 | Watkins et al. |
| 6,624,966 | B1 | 9/2003 | Gustafson et al. |
| 6,624,980 | B1 | 9/2003 | Watson et al. |
| 6,624,983 | B1 | 9/2003 | Berding |
| 6,628,473 | B1 | 9/2003 | Codilian et al. |
| 6,634,086 | B2 | 10/2003 | Korkowski et al. |
| 6,639,757 | B2 | 10/2003 | Morley et al. |
| 6,654,200 | B1 | 11/2003 | Alexander et al. |
| 6,656,772 | B2 | 12/2003 | Huang |
| 6,657,811 | B1 | 12/2003 | Codilian |
| 6,661,597 | B1 | 12/2003 | Codilian et al. |
| 6,661,603 | B1 | 12/2003 | Watkins et al. |
| 6,672,879 | B2 | 1/2004 | Neidich et al. |
| 6,674,600 | B1 | 1/2004 | Codilian et al. |
| 6,690,637 | B1 | 2/2004 | Codilian |
| 6,693,767 | B1 | 2/2004 | Butler |
| 6,693,773 | B1 | 2/2004 | Sassine |
| 6,697,217 | B1 | 2/2004 | Codilian |
| 6,698,286 | B1 | 3/2004 | Little et al. |
| 6,700,736 | B1 | 3/2004 | Wu et al. |
| 6,703,556 | B2 | 3/2004 | Darveniza |
| 6,703,566 | B1 | 3/2004 | Shiraishi et al. |
| 6,704,167 | B1 | 3/2004 | Scura et al. |
| 6,707,637 | B1 | 3/2004 | Codilian et al. |
| 6,707,641 | B1 | 3/2004 | Oveyssi et al. |
| 6,708,389 | B1 | 3/2004 | Carlson et al. |
| 6,710,980 | B1 | 3/2004 | Hauert et al. |
| 6,710,981 | B1 | 3/2004 | Oveyssi et al. |
| 6,728,062 | B1 | 4/2004 | Ou-Yang et al. |
| 6,728,063 | B1 | 4/2004 | Gustafson et al. |
| 6,731,470 | B1 | 5/2004 | Oveyssi |
| 6,735,033 | B1 | 5/2004 | Codilian et al. |
| 6,741,426 | B2 | 5/2004 | Girard |
| 6,741,428 | B1 | 5/2004 | Oveyssi |
| 6,751,051 | B1 | 6/2004 | Garbarino |
| 6,754,042 | B1 | 6/2004 | Chiou et al. |
| 6,757,132 | B1 | 6/2004 | Watson et al. |
| 6,757,136 | B2 | 6/2004 | Buske et al. |
| 6,757,137 | B1 | 6/2004 | Mei |
| 6,758,686 | B2 | 7/2004 | Burdick |
| 6,759,784 | B1 | 7/2004 | Gustafson et al. |
| 6,765,763 | B2 | 7/2004 | SeeToh et al. |
| 6,781,780 | B1 | 8/2004 | Codilian |
| 6,781,787 | B1 | 8/2004 | Codilian et al. |
| 6,781,791 | B1 | 8/2004 | Griffin et al. |
| 6,790,066 | B1 | 9/2004 | Klein |
| 6,791,791 | B1 | 9/2004 | Alfred et al. |
| 6,791,801 | B1 | 9/2004 | Oveyssi |
| 6,795,262 | B1 | 9/2004 | Codilian et al. |
| 6,798,603 | B1 | 9/2004 | Singh et al. |
| 6,801,389 | B1 | 10/2004 | Berding et al. |
| 6,801,404 | B1 | 10/2004 | Oveyssi |
| 6,816,342 | B1 | 11/2004 | Oveyssi |
| 6,816,343 | B1 | 11/2004 | Oveyssi |
| 6,825,622 | B1 | 11/2004 | Ryan et al. |
| 6,826,009 | B1 | 11/2004 | Scura et al. |
| 6,831,810 | B1 | 12/2004 | Butler et al. |
| 6,839,199 | B1 | 1/2005 | Alexander, Jr. et al. |
| 6,844,996 | B1 | 1/2005 | Berding et al. |
| 6,847,504 | B1 | 1/2005 | Bennett et al. |
| 6,847,506 | B1 | 1/2005 | Lin et al. |
| 6,856,491 | B1 | 2/2005 | Oveyssi |
| 6,856,492 | B2 | 2/2005 | Oveyssi |
| 6,862,154 | B1 | 3/2005 | Subrahmanyam et al. |
| 6,862,156 | B1 | 3/2005 | Lin et al. |
| 6,862,176 | B1 | 3/2005 | Codilian et al. |
| 6,865,049 | B1 | 3/2005 | Codilian et al. |
| 6,865,055 | B1 | 3/2005 | Ou-Yang et al. |
| 6,867,946 | B1 | 3/2005 | Berding et al. |
| 6,867,950 | B1 | 3/2005 | Lin |
| 6,876,514 | B1 | 4/2005 | Little |
| 6,879,466 | B1 | 4/2005 | Oveyssi et al. |
| 6,888,697 | B1 | 5/2005 | Oveyssi |
| 6,888,698 | B1 | 5/2005 | Berding et al. |
| 6,891,696 | B1 | 5/2005 | Ou-Yang et al. |
| 6,898,052 | B1 | 5/2005 | Oveyssi |
| 6,900,961 | B1 | 5/2005 | Butler |
| 6,906,880 | B1 | 6/2005 | Codilian |
| 6,906,897 | B1 | 6/2005 | Oveyssi |
| 6,908,330 | B2 | 6/2005 | Garrett et al. |
| 6,922,308 | B1 | 7/2005 | Butler |
| 6,930,848 | B1 | 8/2005 | Codilian et al. |
| 6,930,857 | B1 | 8/2005 | Lin et al. |
| 6,934,126 | B1 | 8/2005 | Berding et al. |
| 6,937,441 | B2 | 8/2005 | Okamoto et al. |
| 6,937,444 | B1 | 8/2005 | Oveyssi |
| 6,940,698 | B2 | 9/2005 | Lin et al. |
| 6,941,642 | B1 | 9/2005 | Subrahmanyam et al. |
| 6,947,251 | B1 | 9/2005 | Oveyssi et al. |
| 6,950,275 | B1 | 9/2005 | Ali et al. |
| 6,950,284 | B1 | 9/2005 | Lin |
| 6,952,318 | B1 | 10/2005 | Ngo |
| 6,954,329 | B1 | 10/2005 | Ojeda et al. |
| 6,958,884 | B1 | 10/2005 | Ojeda et al. |
| 6,958,890 | B1 | 10/2005 | Lin et al. |
| 6,961,212 | B1 | 11/2005 | Gustafson et al. |
| 6,961,218 | B1 | 11/2005 | Lin et al. |
| 6,963,469 | B1 | 11/2005 | Gustafson et al. |
| 6,965,500 | B1 | 11/2005 | Hanna et al. |
| 6,967,800 | B1 | 11/2005 | Chen et al. |

(56) References Cited

U.S. PATENT DOCUMENTS

| | | |
|---|---|---|
| 6,967,804 B1 | 11/2005 | Codilian |
| 6,967,820 B2 | 11/2005 | Horie et al. |
| 6,970,329 B1 | 11/2005 | Oveyssi et al. |
| 6,972,924 B1 | 12/2005 | Chen et al. |
| 6,972,926 B1 | 12/2005 | Codilian |
| 6,975,476 B1 | 12/2005 | Berding |
| 6,979,931 B1 | 12/2005 | Gustafson et al. |
| 6,980,391 B1 | 12/2005 | Haro |
| 6,980,401 B1 | 12/2005 | Narayanan et al. |
| 6,982,853 B1 | 1/2006 | Oveyssi et al. |
| 6,989,953 B1 | 1/2006 | Codilian |
| 6,990,727 B1 | 1/2006 | Butler et al. |
| 6,992,862 B2 | 1/2006 | Childers et al. |
| 6,996,893 B1 | 2/2006 | Ostrander et al. |
| 7,000,309 B1 | 2/2006 | Klassen et al. |
| 7,006,324 B1 | 2/2006 | Oveyssi et al. |
| 7,013,731 B1 | 3/2006 | Szeremeta et al. |
| 7,031,104 B1 | 4/2006 | Butt et al. |
| 7,035,050 B1 | 4/2006 | Kulangara |
| 7,035,053 B1 | 4/2006 | Oveyssi et al. |
| 7,050,270 B1 | 5/2006 | Oveyssi et al. |
| 7,057,852 B1 | 6/2006 | Butler et al. |
| 7,059,868 B1 | 6/2006 | Yan |
| 7,062,837 B1 | 6/2006 | Butler |
| 7,064,921 B1 | 6/2006 | Yang et al. |
| 7,064,922 B1 | 6/2006 | Alfred et al. |
| 7,064,932 B1 | 6/2006 | Lin et al. |
| 7,075,701 B2 | 7/2006 | Novotny et al. |
| 7,085,098 B1 | 8/2006 | Yang et al. |
| 7,085,108 B1 | 8/2006 | Oveyssi et al. |
| 7,092,216 B1 | 8/2006 | Chang et al. |
| 7,092,251 B1 | 8/2006 | Henry |
| 7,099,099 B1 | 8/2006 | Codilian et al. |
| 7,099,117 B1 | 8/2006 | Subrahmanyam et al. |
| 7,110,222 B2 | 9/2006 | Erpelding |
| 7,113,371 B1 | 9/2006 | Hanna et al. |
| 7,142,397 B1 | 11/2006 | Venk |
| 7,145,753 B1 | 12/2006 | Chang et al. |
| 7,154,708 B2 | 12/2006 | Chhabra et al. |
| RE39,478 E | 1/2007 | Hatch et al. |
| 7,161,768 B1 | 1/2007 | Oveyssi |
| 7,161,769 B1 | 1/2007 | Chang et al. |
| 7,180,711 B1 | 2/2007 | Chang et al. |
| 7,193,819 B1 | 3/2007 | Chen et al. |
| 7,205,484 B2 | 4/2007 | Shiraishi et al. |
| 7,209,317 B1 | 4/2007 | Berding et al. |
| 7,209,319 B1 | 4/2007 | Watkins et al. |
| D542,289 S | 5/2007 | Diebel |
| 7,212,377 B1 | 5/2007 | Ou-Yang et al. |
| 7,215,513 B1 | 5/2007 | Chang et al. |
| 7,215,514 B1 | 5/2007 | Yang et al. |
| 7,224,551 B1 | 5/2007 | Ou-Yang et al. |
| D543,981 S | 6/2007 | Diebel |
| 7,227,725 B1 | 6/2007 | Chang et al. |
| 7,239,475 B1 | 7/2007 | Lin et al. |
| 7,245,458 B2 | 7/2007 | Zhang et al. |
| 7,271,978 B1 | 9/2007 | Santini et al. |
| 7,274,534 B1 | 9/2007 | Choy et al. |
| 7,280,311 B1 | 10/2007 | Ou-Yang et al. |
| 7,280,317 B1 | 10/2007 | Little et al. |
| 7,280,319 B1 | 10/2007 | McNab |
| 7,292,406 B1 | 11/2007 | Huang |
| 7,298,584 B1 | 11/2007 | Yamada et al. |
| 7,298,593 B2 | 11/2007 | Yao et al. |
| 7,327,537 B1 | 2/2008 | Oveyssi |
| 7,339,268 B1 | 3/2008 | Ho et al. |
| 7,342,746 B1 | 3/2008 | Lin |
| 7,344,060 B2 | 3/2008 | Koh |
| RE40,203 E | 4/2008 | Hatch et al. |
| 7,353,524 B1 | 4/2008 | Lin et al. |
| 7,359,154 B2 | 4/2008 | Yao et al. |
| 7,369,368 B1 | 5/2008 | Mohajerani |
| 7,372,669 B2 | 5/2008 | Deguchi et al. |
| 7,372,670 B1 | 5/2008 | Oveyssi |
| 7,375,874 B1 | 5/2008 | Novotny et al. |
| 7,375,929 B1 | 5/2008 | Chang et al. |
| 7,379,266 B1 | 5/2008 | Ou-Yang et al. |
| 7,381,904 B1 | 6/2008 | Codilian |
| 7,385,784 B1 | 6/2008 | Berding et al. |
| 7,388,731 B1 | 6/2008 | Little et al. |
| 7,388,733 B2 | 6/2008 | Swanson et al. |
| 7,391,594 B2 | 6/2008 | Fu et al. |
| 7,394,139 B2 | 7/2008 | Park et al. |
| 7,414,814 B1 | 8/2008 | Pan |
| 7,420,771 B1 | 9/2008 | Hanke et al. |
| 7,434,987 B1 | 10/2008 | Gustafson et al. |
| 7,436,625 B1 | 10/2008 | Chiou et al. |
| 7,440,234 B1 | 10/2008 | Cheng et al. |
| 7,440,236 B1 | 10/2008 | Bennin et al. |
| 7,450,346 B2 | 11/2008 | Arya et al. |
| 7,477,488 B1 | 1/2009 | Zhang et al. |
| 7,477,489 B1 | 1/2009 | Chen et al. |
| 7,482,800 B2 | 1/2009 | Ooyabu et al. |
| 7,484,291 B1 | 2/2009 | Ostrander et al. |
| 7,505,231 B1 | 3/2009 | Golgolab et al. |
| 7,515,240 B2 | 4/2009 | Lu et al. |
| 7,518,830 B1 | 4/2009 | Panchal et al. |
| 7,522,382 B1 | 4/2009 | Pan |
| 7,525,767 B2 | 4/2009 | Erpelding |
| 7,525,769 B2 | 4/2009 | Yao et al. |
| 7,529,064 B1 | 5/2009 | Huang et al. |
| 7,538,981 B1 | 5/2009 | Pan |
| 7,561,374 B1 | 7/2009 | Codilian et al. |
| 7,567,410 B1 | 7/2009 | Zhang et al. |
| 7,576,955 B1 | 8/2009 | Yang et al. |
| 7,593,181 B1 | 9/2009 | Tsay et al. |
| 7,605,999 B1 | 10/2009 | Kung et al. |
| 7,609,486 B1 | 10/2009 | Little |
| 7,610,672 B1 | 11/2009 | Liebman |
| 7,616,408 B2 | 11/2009 | Choi et al. |
| 7,633,721 B1 | 12/2009 | Little et al. |
| 7,633,722 B1 | 12/2009 | Larson et al. |
| 7,652,890 B2 | 1/2010 | Ohsawa et al. |
| 7,656,609 B1 | 2/2010 | Berding et al. |
| 7,660,075 B1 | 2/2010 | Lin et al. |
| 7,672,083 B1 | 3/2010 | Yu et al. |
| 7,684,155 B1 | 3/2010 | Huang et al. |
| 7,686,555 B1 | 3/2010 | Larson et al. |
| 7,697,102 B2 | 4/2010 | Hirakata et al. |
| 7,709,078 B1 | 5/2010 | Sevier et al. |
| 7,715,149 B1 | 5/2010 | Liebman et al. |
| 7,729,091 B1 | 6/2010 | Huang et al. |
| 7,751,145 B1 | 7/2010 | Lin et al. |
| 7,760,470 B2 | 7/2010 | Wu et al. |
| 7,764,467 B2 | 7/2010 | Hanya et al. |
| 7,819,980 B2 | 10/2010 | Hsia et al. |
| 7,826,177 B1 * | 11/2010 | Zhang et al. ............... 360/245.3 |
| 7,852,601 B1 | 12/2010 | Little |
| 7,864,488 B1 | 1/2011 | Pan |
| 7,876,664 B2 | 1/2011 | Tsukagoshi et al. |
| 7,898,770 B1 | 3/2011 | Zhang et al. |
| 7,903,369 B1 | 3/2011 | Codilian et al. |
| 7,907,369 B1 | 3/2011 | Pan |
| 7,911,742 B1 | 3/2011 | Chang et al. |
| 7,926,167 B1 | 4/2011 | Liebman et al. |
| 7,957,095 B1 | 6/2011 | Tsay et al. |
| 7,957,102 B1 | 6/2011 | Watson et al. |
| 7,961,436 B1 | 6/2011 | Huang et al. |
| 8,004,782 B1 | 8/2011 | Nojaba et al. |
| 8,009,384 B1 | 8/2011 | Little |
| 8,015,692 B1 | 9/2011 | Zhang et al. |
| 8,018,687 B1 | 9/2011 | Little et al. |
| 8,030,576 B2 | 10/2011 | Kamei et al. |
| 8,031,431 B1 | 10/2011 | Berding et al. |
| 8,064,168 B1 | 11/2011 | Zhang et al. |
| 8,064,170 B1 | 11/2011 | Pan |
| 8,068,314 B1 | 11/2011 | Pan et al. |
| 8,081,401 B1 | 12/2011 | Huang et al. |
| 8,100,017 B1 | 1/2012 | Blick et al. |
| 8,111,483 B2 | 2/2012 | Arai |
| 8,116,038 B1 | 2/2012 | Zhang et al. |
| 8,125,740 B1 | 2/2012 | Yang et al. |
| 8,142,671 B1 | 3/2012 | Pan |
| 8,156,633 B1 | 4/2012 | Foisy |

(56) References Cited

U.S. PATENT DOCUMENTS

| | | | |
|---|---|---|---|
| 8,159,785 B1 | 4/2012 | Lee et al. | |
| 8,169,746 B1 | 5/2012 | Rice et al. | |
| 8,189,298 B1 | 5/2012 | Lee et al. | |
| 8,194,348 B2 | 6/2012 | Jacoby et al. | |
| 8,194,354 B1 | 6/2012 | Zhang et al. | |
| 8,194,355 B1 | 6/2012 | Pan et al. | |
| 8,203,806 B2 | 6/2012 | Larson et al. | |
| 8,223,453 B1 | 7/2012 | Norton et al. | |
| 8,228,631 B1 | 7/2012 | Tsay et al. | |
| 8,233,239 B1 | 7/2012 | Teo et al. | |
| 8,248,733 B1 | 8/2012 | Radavicius et al. | |
| 8,259,417 B1 | 9/2012 | Ho et al. | |
| 8,274,760 B1 | 9/2012 | Zhang et al. | |
| 8,276,256 B1 | 10/2012 | Zhang et al. | |
| 8,279,560 B1 | 10/2012 | Pan | |
| 8,284,514 B1 | 10/2012 | Garbarino | |
| 8,289,646 B1 | 10/2012 | Heo et al. | |
| 8,295,013 B1 * | 10/2012 | Pan et al. | 360/245.4 |
| 8,295,014 B1 | 10/2012 | Teo et al. | |
| 8,300,352 B1 | 10/2012 | Larson et al. | |
| 8,305,708 B2 | 11/2012 | Tacklind | |
| 8,320,084 B1 * | 11/2012 | Shum et al. | 360/245.9 |
| 8,320,086 B1 | 11/2012 | Moradnouri et al. | |
| 8,322,021 B1 | 12/2012 | Berding et al. | |
| 8,325,446 B1 * | 12/2012 | Liu et al. | 360/245.9 |
| 8,325,447 B1 | 12/2012 | Pan | |
| 8,339,748 B2 | 12/2012 | Shum et al. | |
| 8,345,387 B1 | 1/2013 | Nguyen | |
| 8,363,351 B1 | 1/2013 | Little | |
| 8,369,044 B2 | 2/2013 | Howie et al. | |
| 8,411,389 B1 | 4/2013 | Tian et al. | |
| 8,416,522 B1 | 4/2013 | Schott et al. | |
| 8,416,534 B1 | 4/2013 | Heo et al. | |
| 8,422,171 B1 | 4/2013 | Guerini | |
| 8,422,175 B1 | 4/2013 | Oveyssi | |
| 8,432,641 B1 | 4/2013 | Nguyen | |
| 8,437,101 B1 | 5/2013 | German et al. | |
| 8,438,721 B1 | 5/2013 | Sill | |
| 8,446,688 B1 | 5/2013 | Quines et al. | |
| 8,451,559 B1 | 5/2013 | Berding et al. | |
| 8,467,153 B1 * | 6/2013 | Pan et al. | 360/264.2 |
| 8,472,131 B1 | 6/2013 | Ou-Yang et al. | |
| 8,477,459 B1 * | 7/2013 | Pan | 360/245.9 |
| 8,477,460 B1 | 7/2013 | Liebman | |
| 8,488,270 B2 | 7/2013 | Brause et al. | |
| 8,488,280 B1 | 7/2013 | Myers et al. | |
| 8,499,652 B1 | 8/2013 | Tran et al. | |
| 8,514,514 B1 | 8/2013 | Berding et al. | |
| 8,530,032 B1 | 9/2013 | Sevier et al. | |
| 8,542,465 B2 | 9/2013 | Liu et al. | |
| 8,547,664 B1 | 10/2013 | Foisy et al. | |
| 8,553,356 B1 | 10/2013 | Heo et al. | |
| 8,553,366 B1 | 10/2013 | Hanke | |
| 8,553,367 B1 | 10/2013 | Foisy et al. | |
| 8,564,909 B1 | 10/2013 | Dunn et al. | |
| 8,611,052 B1 | 12/2013 | Pan et al. | |
| 8,616,900 B1 | 12/2013 | Lion | |
| 8,665,555 B1 | 3/2014 | Young et al. | |
| 8,665,566 B1 * | 3/2014 | Pan et al. | 360/264.2 |
| 8,667,667 B1 | 3/2014 | Nguyen et al. | |
| 8,693,139 B2 | 4/2014 | Tian et al. | |
| 8,693,140 B1 | 4/2014 | Weiher et al. | |
| 8,699,179 B1 | 4/2014 | Golgolab et al. | |
| 8,702,998 B1 * | 4/2014 | Guerini | 216/13 |
| 8,705,201 B2 | 4/2014 | Casey et al. | |
| 8,705,209 B2 | 4/2014 | Seymour et al. | |
| 8,711,521 B2 | 4/2014 | Feng et al. | |
| 8,717,706 B1 | 5/2014 | German et al. | |
| 8,743,509 B1 | 6/2014 | Heo et al. | |
| 8,755,148 B1 | 6/2014 | Howie et al. | |
| 8,756,776 B1 | 6/2014 | Chen et al. | |
| 8,760,800 B1 | 6/2014 | Brown et al. | |
| 8,760,812 B1 * | 6/2014 | Chen et al. | 360/244.1 |
| 8,760,814 B1 | 6/2014 | Pan et al. | |
| 8,760,816 B1 | 6/2014 | Myers et al. | |
| 8,773,812 B1 | 7/2014 | Gustafson et al. | |
| 8,780,491 B1 | 7/2014 | Perlas et al. | |
| 8,780,504 B1 | 7/2014 | Teo et al. | |
| 8,792,205 B1 | 7/2014 | Boye-Doe et al. | |
| 8,797,677 B2 | 8/2014 | Heo et al. | |
| 8,797,689 B1 | 8/2014 | Pan et al. | |
| 8,810,972 B1 | 8/2014 | Dunn | |
| 8,824,095 B1 | 9/2014 | Dougherty | |
| 8,824,098 B1 | 9/2014 | Huang et al. | |
| 8,885,299 B1 | 11/2014 | Bennin et al. | |
| 8,934,199 B1 * | 1/2015 | Pan | 360/245.4 |
| 8,941,952 B1 * | 1/2015 | Pan et al. | 360/244.1 |
| 2001/0017749 A1 | 8/2001 | Stefansky | |
| 2001/0021596 A1 | 9/2001 | Tamura | |
| 2002/0186508 A1 | 12/2002 | Kube et al. | |
| 2003/0128474 A1 | 7/2003 | Schulz et al. | |
| 2003/0147177 A1 | 8/2003 | Yao et al. | |
| 2004/0228039 A1 | 11/2004 | Wu et al. | |
| 2005/0030670 A1 | 2/2005 | Ando et al. | |
| 2005/0042894 A1 | 2/2005 | Wu et al. | |
| 2005/0237672 A1 | 10/2005 | Kamigama et al. | |
| 2005/0243472 A1 | 11/2005 | Kamigama et al. | |
| 2005/0254175 A1 * | 11/2005 | Swanson et al. | 360/245.9 |
| 2006/0098347 A1 | 5/2006 | Yao et al. | |
| 2006/0146262 A1 | 7/2006 | Yu et al. | |
| 2006/0157869 A1 | 7/2006 | Huang et al. | |
| 2007/0075056 A1 | 4/2007 | Ho et al. | |
| 2007/0153427 A1 | 7/2007 | Izumi et al. | |
| 2007/0246251 A1 | 10/2007 | Shiraishi et al. | |
| 2007/0279807 A1 | 12/2007 | Kobayashi et al. | |
| 2008/0002303 A1 | 1/2008 | Wang et al. | |
| 2008/0068757 A1 | 3/2008 | Kamigama et al. | |
| 2008/0088975 A1 | 4/2008 | Bennin et al. | |
| 2008/0225439 A1 | 9/2008 | Komura | |
| 2008/0247131 A1 | 10/2008 | Hitomi et al. | |
| 2009/0151994 A1 | 6/2009 | Ohsawa et al. | |
| 2009/0207529 A1 | 8/2009 | Yao | |
| 2009/0211789 A1 | 8/2009 | Yeates et al. | |
| 2009/0253233 A1 | 10/2009 | Chang et al. | |
| 2010/0007993 A1 | 1/2010 | Contreras et al. | |
| 2010/0046351 A1 | 2/2010 | Mccaslin et al. | |
| 2010/0118444 A1 | 5/2010 | Rothenberg et al. | |
| 2010/0176827 A1 | 7/2010 | Yamazaki et al. | |
| 2010/0188778 A1 | 7/2010 | Castagna | |
| 2010/0195474 A1 | 8/2010 | Tsukuda et al. | |
| 2010/0220414 A1 | 9/2010 | Klarqvist et al. | |
| 2011/0212281 A1 | 9/2011 | Jacoby et al. | |
| 2011/0317309 A1 | 12/2011 | Shum et al. | |
| 2012/0067626 A1 | 3/2012 | Mizutani | |
| 2013/0038964 A1 | 2/2013 | Garbarino et al. | |
| 2013/0091698 A1 | 4/2013 | Banshak, Jr. et al. | |
| 2013/0155546 A1 | 6/2013 | Heo et al. | |
| 2013/0290988 A1 | 10/2013 | Watson et al. | |

OTHER PUBLICATIONS

Tzong-Shii Pan, et al., U.S. Appl. No. 12/195,288, filed Aug. 20, 2008, 16 pages.

Office Action dated Jun. 12, 2015 from U.S. Appl. No. 14/322,616, 10 pages.

Notice of Allowance dated Jun. 22, 2015 from U.S. Appl. No. 14/209,909, 10 pages.

Office Action dated Feb. 25, 2015 from U.S. Appl. No. 14/209,909, 13 pages.

Chinse Patent Application No. 201410752943X, filed Dec. 10, 2014.

Non-Final Office Action dated Feb. 25, 2015 from U.S. Appl. No. 14/209,909, 13 pages.

Non-Final Office Action dated Jun. 12, 2015 U.S. Appl. No. 14/322,616, 10 pages.

Yih-Jen D. Chen, et al., U.S. Appl. No. 13/952,874, filed Jul. 29, 2013, 20 pages.

Yih-Jen D. Chen, et al., U.S. Appl. No. 14/209,909, filed Mar. 13, 2014, 31 pages.

Yih-Jen D. Chen, et al., U.S. Appl. No. 14/322,616, filed Jul. 2, 2014, 20 pages.

* cited by examiner

DISK DRIVE HEAD SUSPENSION TAIL WITH A NOBLE METAL LAYER DISPOSED ON A PLURALITY OF STRUCTURAL BACKING ISLANDS

CROSS-REFERENCE TO RELATED APPLICATIONS

This application claims priority under 35 U.S.C. §120 as a continuation-in part to pending U.S. patent application Ser. No. 14/322,616 filed on Jul. 2, 2014, entitled "DISK DRIVE HEAD SUSPENSION TAIL WITH GROUND PAD OUTSIDE OF BONDING REGION," which claims priority under 35 U.S.C. §120 as a continuation-in part to pending U.S. patent application Ser. No. 14/209,909 filed on Mar. 13, 2014, entitled "DISK DRIVE HEAD SUSPENSION TAIL WITH STIFFENED EDGE ALIGNMENT FEATURES," which claims priority to provisional U.S. Patent Application Ser. No. 61/914,315, entitled "DISK DRIVE HEAD SUSPENSION TAIL ALIGNMENT FEATURE," filed on Dec. 10, 2013.

BACKGROUND

Information storage devices are used to retrieve and/or store data in computers and other consumer electronics devices. A magnetic hard disk drive is an example of an information storage device that includes one or more heads that can both read and write, but other information storage devices also include heads—sometimes including heads that cannot write.

In a modern magnetic hard disk drive device, each head is a sub-component of a head gimbal assembly (HGA) that typically includes a head, and a suspension assembly with a laminated flexure to carry the electrical signals to and from the head. The HGA, in turn, is a sub-component of a head stack assembly (HSA) that typically includes a plurality of HGAs, an actuator, and a flexible printed circuit. The plurality of HGAs are attached to various arms of the actuator.

Modern laminated flexures typically include conductive copper traces (e.g. an alloy of copper) that are isolated from a stainless steel structural layer by a polyimide dielectric layer. So that the signals from/to the head can reach the flexible printed circuit (FPC) on the actuator body, each suspension assembly includes a flexure tail that extends away from the head along a corresponding actuator arm and ultimately attaches to the FPC adjacent the actuator body. That is, the flexure includes traces that extend from adjacent the head and continue along the flexure tail to a plurality of flexure bond pads for electrical connection to the FPC. The FPC includes conductive electrical traces that terminate in a plurality of FPC bond pads that correspond to and are electrically connected to the flexure bond pads.

To facilitate electrical connection of the conductive traces of the flexure tails to the conductive electrical terminals of the FPC during the HSA manufacturing process, the flexure tails must first be properly positioned relative to the FPC so that the flexure bond pads are aligned with the FPC bond pads. Then the flexure tails must be held or constrained against the FPC bond pads while the aforementioned electrical connections are made, e.g., by ultrasonic bonding, solder jet bonding, solder bump reflow, or anisotropic conductive film (ACF) bonding.

An anisotropic conductive film is typically an adhesive doped with conductive beads of similar size or diameter. As the doped adhesive is compressed and cured, it is heated and squeezed between the surfaces to be bonded with sufficient uniform pressure that a single layer of the conductive beads makes contact with both surfaces to be bonded. In this way, the thickness of the adhesive layer between the bonded surfaces becomes approximately equal to the size of the conductive beads. The cured adhesive film may conduct electricity via the contacting beads axially, i.e. in a direction normal to the bonded surfaces, since each bead is forced to contact both of the surfaces to be bonded. However, the cured adhesive film may not conduct electricity parallel to the bonded surfaces, since the beads may not touch each other laterally—hence the term "anisotropic".

Prior to HSA assembly, HGAs are typically tested for acceptable function. For example, the HGAs may undergo so-called dynamic electrical testing (DET) to ensure acceptable function (and/or to characterize HGA performance for subsequent optimization or compensation in the HSA and/or in the assembled disk drive). Such testing typically requires that testing probes make reliable electrical connections to the HSA. In some cases, the flexure tail may include an extra length with enlarged testing pads to facilitate temporary test probe contact. However, such extra length must be cut-away as an extra processing step before or during HSA assembly, and in that case the enlarged testing pads are ultimately not part of the assembled HSA or the assembled disk drive. DET may also require that a reliable ground connection be made between the HGA and the testing apparatus.

Hence, there is a need in the art for a head suspension assembly flexure tail design that can facilitate reliable electrical connections with testing probes and/or ground, without the need for an extra length (e.g. with enlarged testing pads) that must be cut away as an extra processing step before or during HSA assembly.

DESCRIPTION OF THE PREFERRED EMBODIMENTS

Figure 1:
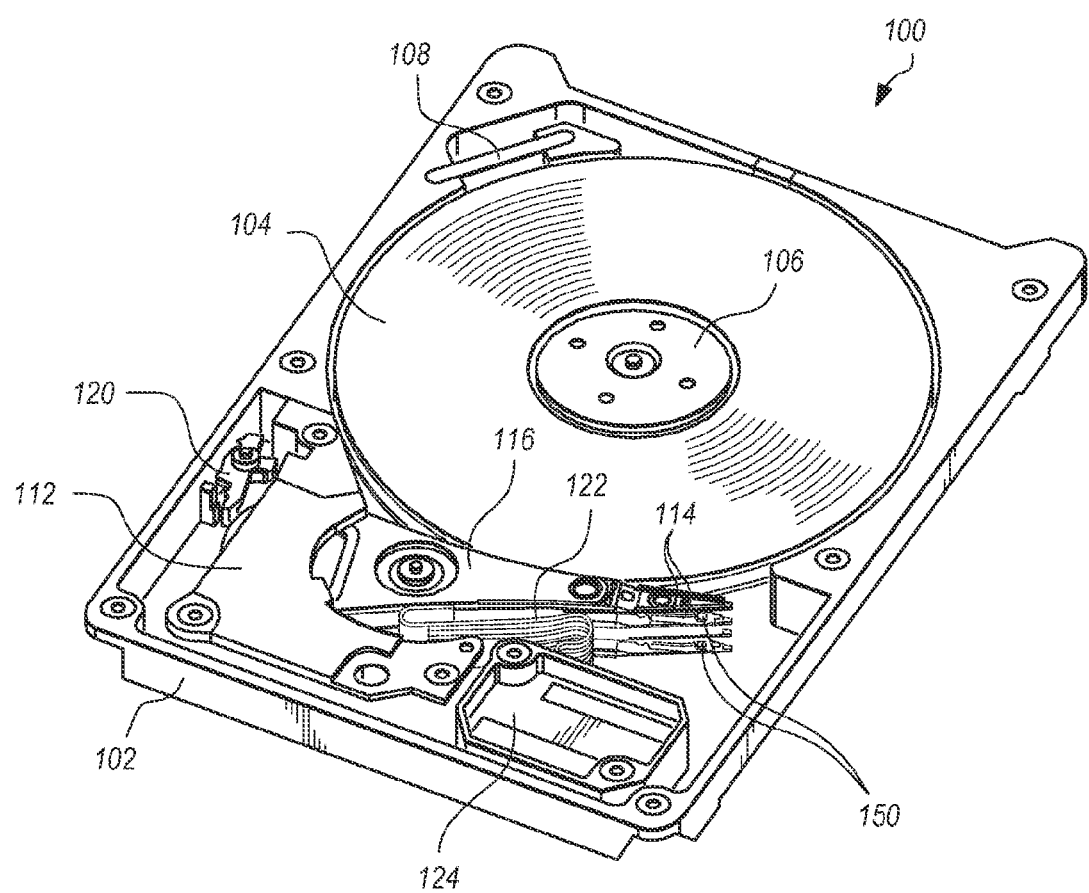
FIG. 1 is a top perspective view of a disk drive capable of including an embodiment of the present invention.

FIG. 1 is a top perspective view of a disk drive 100 capable of including an embodiment of the present invention. The disk drive 100 includes a disk drive base 102 and two annular magnetic disks 104. The disk drive 100 further includes a spindle 106, rotatably mounted on the disk drive base 102, for rotating the disks 104. The rotation of the disks 104 establishes air flow through recirculation filter 108. In other embodiments, disk drive 100 may have only a single disk, or alternatively, more than two disks.

The disk drive 100 further includes an actuator 116 that is rotatably mounted on disk drive base 102. Voice coil motor 112 rotates the actuator 116 through a limited angular range so that at least one head gimbal assembly (HGA) 114 is desirably positioned relative to one or more tracks of information on a corresponding one of the disks 104. In the embodiment of FIG. 1, the actuator 116 includes three arms upon which four HGAs 114 are attached, each corresponding to a surface of one of the two disks 104. However in other embodiments fewer or more HGAs 114 may be included depending on the number of disks 104 that are included and whether the disk drive 100 is depopulated.

Each HGA 114 preferably includes a head 150 for reading from one of the disks 104. The head 150 may be referred to herein as a read head, even though it may also perform other functions and contain other structures such as a writer for writing data, a microactuator, a heater, a lapping guide, etc. The actuator 116 may occasionally be latched at an extreme angular position within the limited angular range, by latch 120. Electrical signals to/from the HGAs 114 are carried to other drive electronics via a flexible printed circuit that includes a flex cable 122 (preferably including a preamplifier circuit) and flex cable bracket 124.

Figure 2:
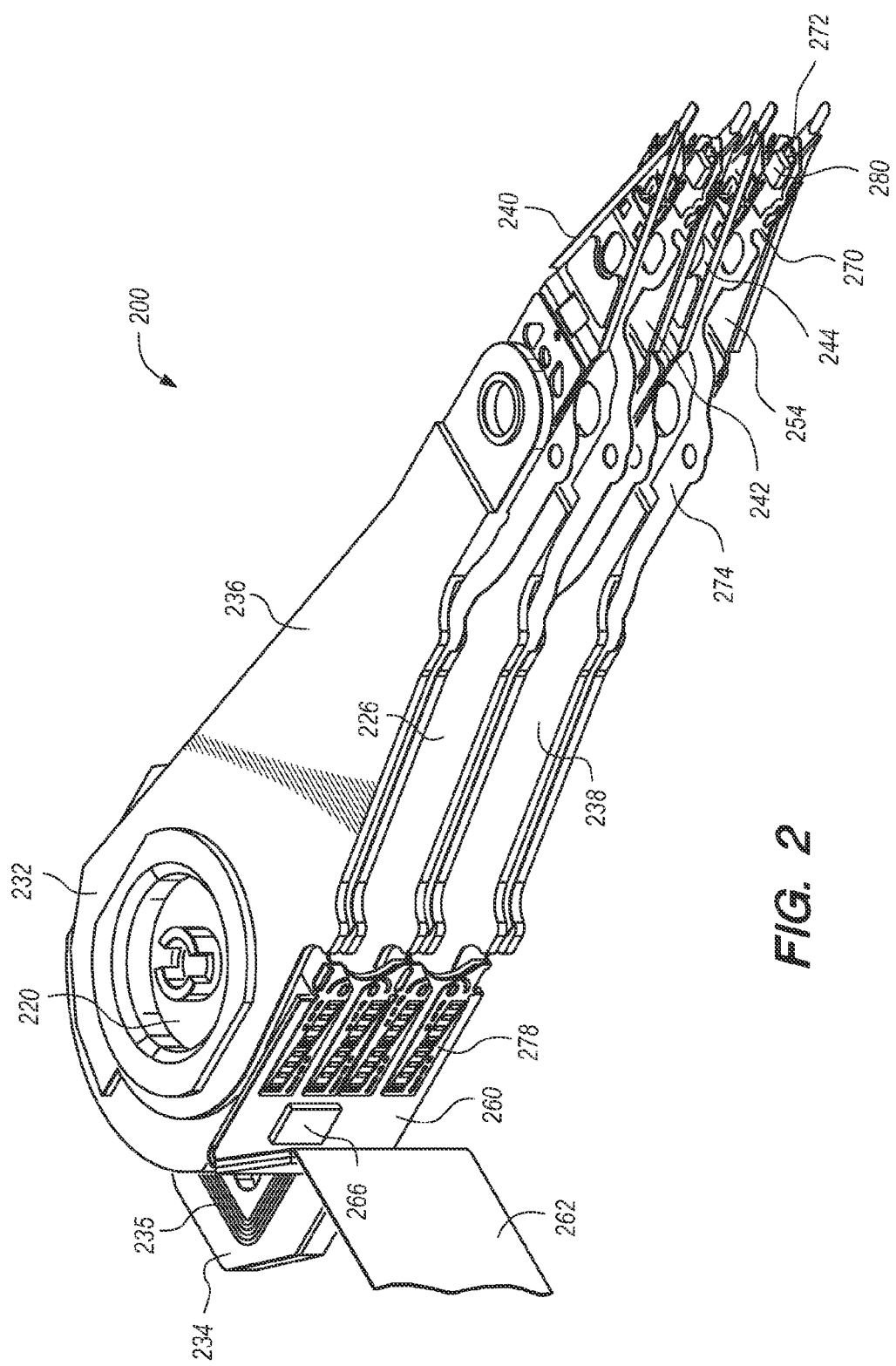
FIG. 2 is a perspective view of a head stack assembly (HSA) capable of including an embodiment of the present invention.

FIG. 2 is a perspective view of a head stack assembly (HSA) 200 capable of including an embodiment of the present invention. The HSA 200 includes an actuator body 232 and a plurality of actuator arms 226, 236, 238 extending from the actuator body 232. The actuator body 232 includes a pivot bearing cartridge 220 disposed in the actuator bore, and a coil support 234 that supports a coil 235 and extends from the actuator body 232 in a direction that is generally opposite the actuator arms 226, 236, 238. The HSA 200 also includes a plurality of head gimbal assemblies (HGA) 240, 242, 244, 254, attached to the actuator arms 226, 236, 238. For example, such attachment may be made by swaging. Note that the inner actuator arm 226 includes two HGAs 242, 244, while each of the outer actuator arms 236, 238, includes only one HGA. This is because in a fully populated disk drive the inner arms are positioned between disk surfaces while the outer actuator arms are positioned over (or under) a single disk surface. In a depopulated disk drive, however, any of the actuator arms may have one or zero HGAs, possibly replaced by a dummy mass.

Each HGA includes a head for reading and/or writing to an adjacent disk surface (e.g. HGA 254 includes head 280). The head 280 is attached to a tongue portion 272 of a laminated flexure 270. The laminated flexure 270 is part of the HGA 254, and is attached to a load beam (the part of the HGA 254 to which the numerical label 254 points). The laminated flexure 270 may include a structural layer (e.g. stainless steel), a dielectric layer (e.g. polyimide), and a conductive layer into which traces are patterned (e.g. copper). The HSA 200 also includes a flexible printed circuit (FPC) 260 adjacent the actuator body 232. The FPC 260 includes a flex cable 262 and a preamplifier 266. The FPC 260 may comprise a laminate that includes two or more conventional dielectric and conductive layer materials (e.g. one or more polymeric materials, copper, etc.). The laminated flexure 270 includes a flexure tail 274 that runs along the actuator arm 238 to a terminal region 278 of the laminated flexure 270 that is electrically connected to bond pads of the FPC 260.

Methods of electrical connection of the flexure tails (e.g. flexure tail 274) to the FPC 260 include ultrasonic bonding of gold coatings thereon, solder reflow, solder ball jet (SBJ), and anisotropic conductive film (ACF) bonding, and are preferably but not necessarily automated. To electrically connect and securely attach the flexure tails to the FPC 260, the flexure tails are first aligned with the FPC 260, and then may be pressed against the FPC 260 (at least temporarily) while electrical connection is established and secure attachment is completed. Maintaining alignment and sufficient uniform pressure and temperature to groups of bond pads may be desirable during this process.

Figure 3:
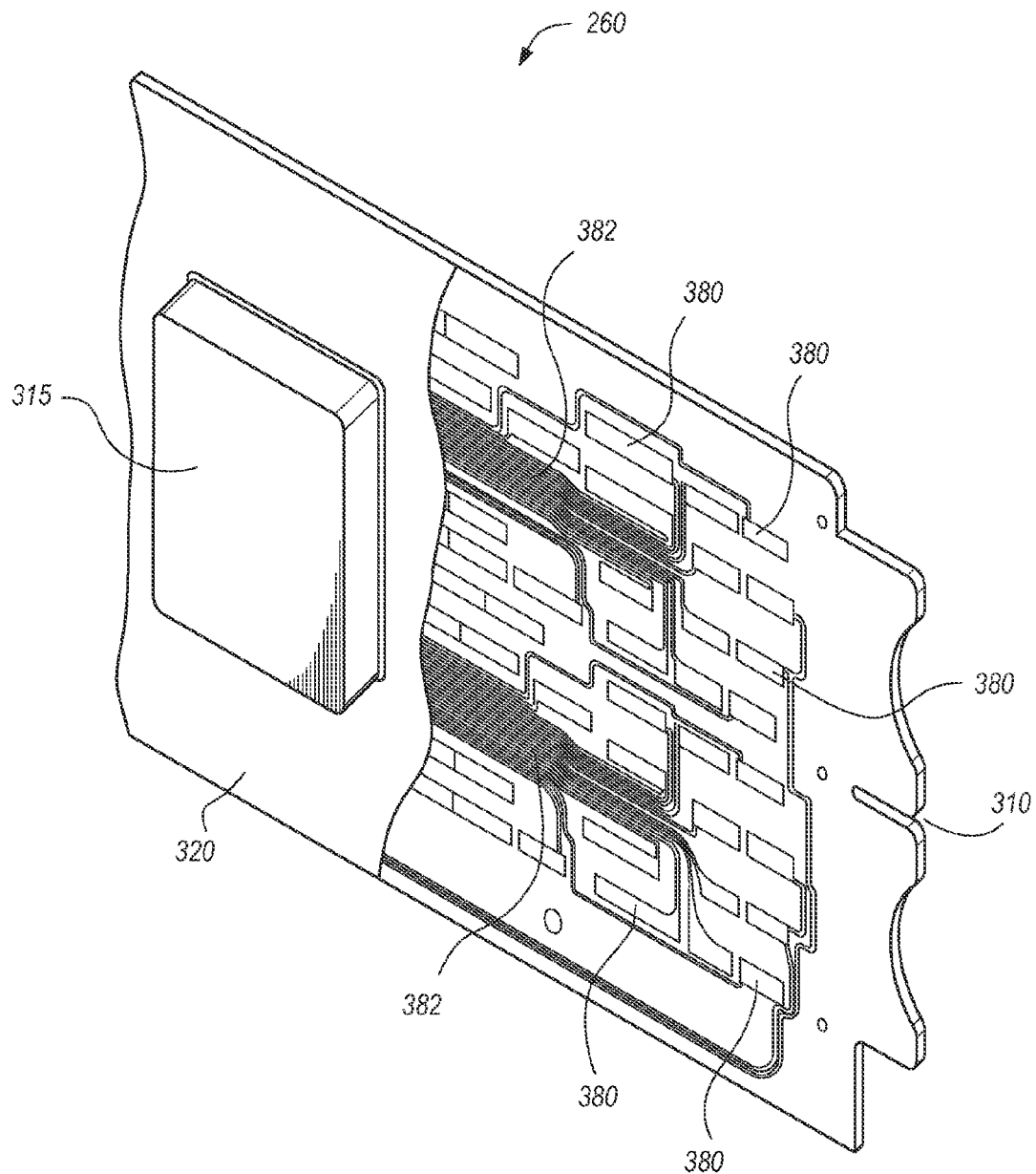
FIG. 3 is a perspective view of a portion of a flexible printed circuit (FPC) capable of use with an embodiment of the present invention.

FIG. 3 depicts the FPC 260 before flexure tail terminal regions (i.e. the portion of each flexure tail that overlaps the FPC, for example, flexure tail terminal region 278) are bonded thereto. The FPC 260 includes electrical conduits 382 that terminate at FPC bond pads 380, which are aligned with and connected to flexure bond pads of the terminal regions (e.g. flexure tail terminal region 278) of the HGA flexure tails. The FPC electrical conduits 382 may connect to a pre-amplifier chip 315 (shown exploded from the FPC 260 in FIG. 3). Two of the HGA flexure tails may pass through the FPC slit 310 to help facilitate their support and alignment.

The FPC 260 may include an optional insulative cover layer 320 having windows exposing the regions where the flexure tail terminal regions and the pre-amplifier chip 315 are bonded thereto. The cover layer 320 is shown cut away in the view of FIG. 3, so that the electrical conduits 382 can be better depicted.

Figure 4A:
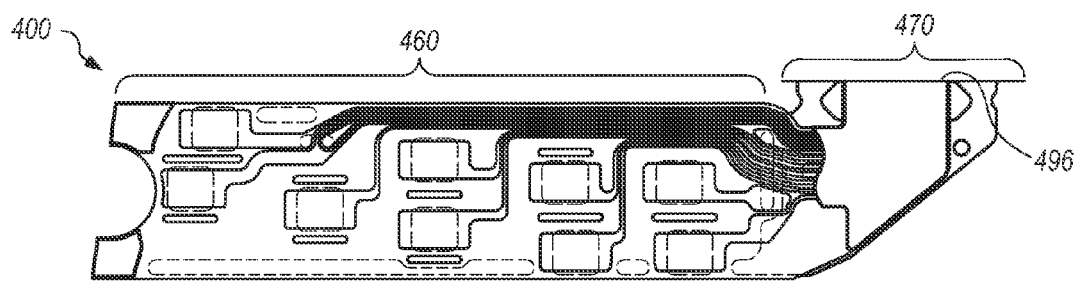
FIG. 4A is an assembled plan view of a flexure tail terminal region, capable of including an embodiment of the present invention.
Figure 4B:
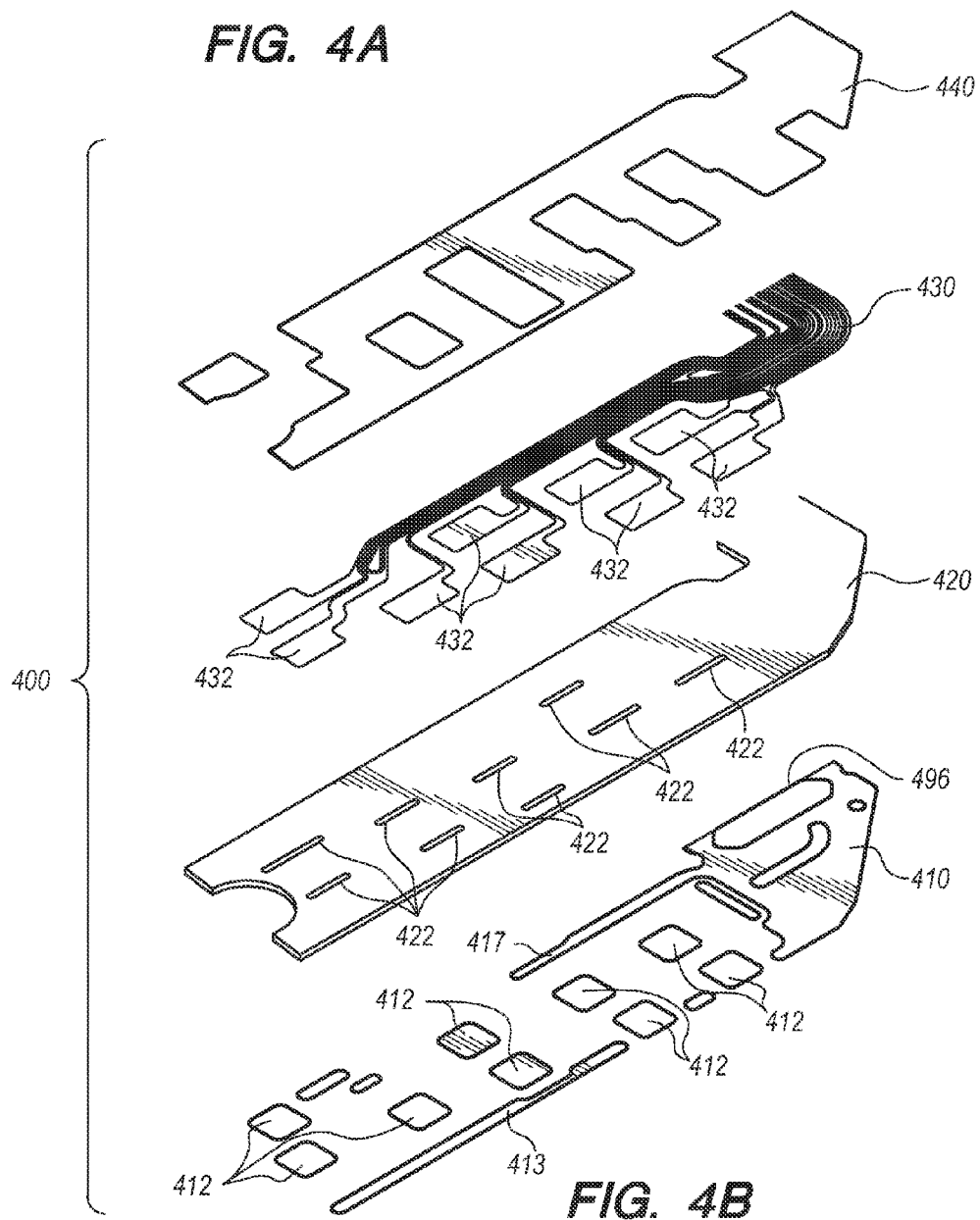
FIG. 4B is an exploded perspective view of the flexure tail terminal region of FIG. 4A.

FIG. 4A is an assembled plan view of a flexure tail terminal region 400, capable of including an embodiment of the present invention. FIG. 4B is an exploded perspective view of the flexure tail terminal region 400. Now referring to FIGS. 4A and 4B, the flexure tail terminal region 400 includes a structural layer 410 (e.g. stainless steel), a conductive layer 430 (e.g. copper), and a dielectric layer 420 (e.g. polyimide) between the structural layer 410 and the conductive layer 430. The flexure tail terminal region 400 may also include an optional cover layer 440 that comprises an electrically insulative material (e.g. an insulative polymer).

The flexure tail terminal region 400 may also include other layers, such as an additional conductive layer and an additional dielectric layer (e.g. in the case of a dual conductive layer flexure), but the layers described herein would still be included as described. In certain embodiments, the thickness of the structural layer 410 may be preferably less than 20 microns, the thickness of the dielectric layer 420 may be preferably less than 15 microns, the thickness of the conductive layer 430 may be preferably less than 15 microns.

Now referring to FIGS. 3, 4A and 4B, the flexure tail terminal region 400 is preferably configured to at least partially overlap the FPC 260 in a bonding area 460, but not in an adjacent area 470. The flexure tail terminal region 400 preferably includes a plurality of flexure bond pads 432 that are defined in the conductive layer 430 and that are aligned with corresponding ones of the plurality of FPC bond pads 380. Some or all of the plurality of flexure bond pads 432 are in electrical communication with a head (e.g. head 280 of FIG. 2).

In certain embodiments, a conventional anisotropic conductive film may be disposed between the FPC 260 and the flexure tail terminal region 400, and the flexure tail terminal region 400 may optionally overlap the anisotropic conductive film in the bonding area 460 but not in the adjacent area 470. In such embodiments, each of the plurality of flexure bond pads 432 is bonded to the corresponding one of the plurality of FPC bond pads 380 by the anisotropic conductive film in the bonding area 460.

Still referring to FIGS. 3, 4A, and 4B, during the head stack assembly process an anisotropic conductive film may be disposed between the FPC 260 and the flexure tail terminal region 400. Optionally, this may be done by overlaying a rectangular strip of the anisotropic conductive film on the FPC 260. Next, a thermode tool may be pressed against a thermode tool application area of the flexure tail terminal region 400 (which in the embodiment of FIG. 4A is preferably but not necessarily coincident with the bonding area 460), to press the flexure bond pads 432 against the FPC bond pads 380 for a period. Since all of the plurality of flexure bond pads 432 are preferably disposed within the thermode tool application area of the flexure tail terminal region 400, the thermode tool simultaneously applies heat and increased pressure to all of the plurality of flexure bond pads 432, to preferably simultaneously bond them to corresponding ones of the plurality of FPC bond pads 380 by the anisotropic conductive film (ACF).

In certain embodiments, the anisotropic conductive film may comprise an adhesive material that includes a plurality of electrically conductive beads. In such embodiments, the electrically conductive beads may be of substantially similar size, and the plurality of electrically conductive beads may be arranged in a monolayer with each of the plurality of electrically conductive beads in electrical contact with one of the plurality of flexure bond pads 432 and the corresponding one of the plurality of FPC bond pads 380. The dielectric layer 420 may optionally include a plurality of through openings 422, for example to control the spread of ACF material used to make electrical connections to the flexure bond pads 432.

In the embodiment of FIGS. 4A and 4B, the structural layer 410 includes a plurality of discontinuous bond pad backing islands 412 that are disposed in alignment with the plurality of flexure bond pads 432. In the embodiment of FIGS. 4A and 4B, the flexure tail terminal region 400 also optionally includes a discontinuous edge stiffener island 413 in the structural layer 410 that does not overlap any of the flexure bond pads 432. In the embodiment of FIGS. 4A and 4B, the flexure tail terminal region 400 further comprises a narrow peninsula 417 in the structural layer 410 that is contiguous with the structural layer 410 in the flexure tail as it runs outside of the flexure tail terminal region (e.g. contiguous with the structural layer that runs along the actuator arm 238 in flexure tail 274 of FIG. 2).

Now referring to FIGS. 3, 4A and 4B, in certain embodiments the FPC 260 preferably may be designed so that the FPC conductive traces 382 are not disposed in locations that would overlap with the discontinuous edge stiffener island 413 or the narrow peninsula 417. Otherwise, such locations may be subject to undesirably high pressure from a thermode tool during the process of bonding the flexure tail terminal region 400 to the FPC 260, which may undesirably reduce the pressure or uniformity of pressure applied to the flexure bond pads by the thermode tool during head stack assembly.

In the embodiment of FIGS. 4A and 4B, the total longitudinal span of the flexure tail terminal region 400 may optionally be in the range of 3 mm to 8 mm, and may include a longitudinal span of the bonding area 460 in the range of 2 mm to 7 mm. In certain embodiments, the adjacent area 470 of the flexure tail terminal region 400, outside the bonding area 460, may have an adjacent area longitudinal span in the range of 1 mm to 3 mm. In the embodiment of FIGS. 4A and 4B, the adjacent area 470 of the flexure tail terminal region 400 may include a bent portion 496 extending approximately normally from a major plane of the flexure tail terminal region 400.

Figure 5A:
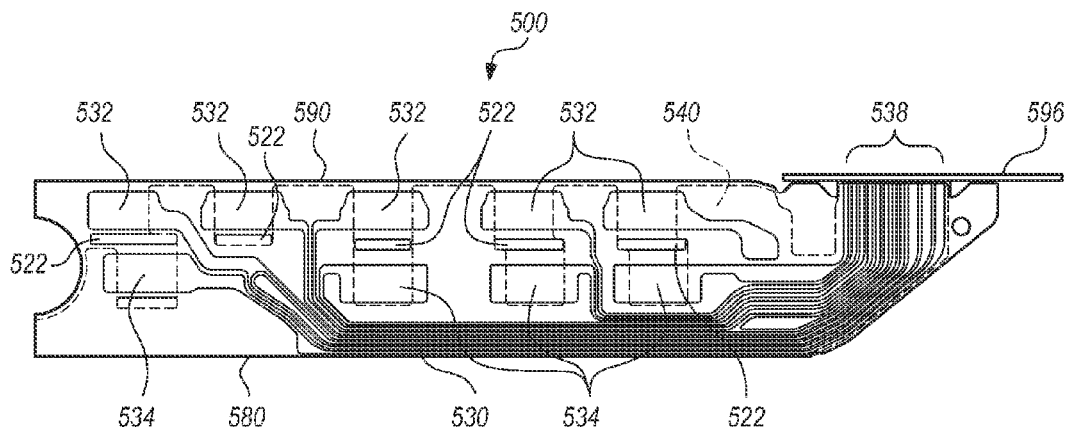
FIG. 5A depicts a plan view of a flexure tail terminal region according to an embodiment of the present invention, facing the conductive layer side.
Figure 5B:
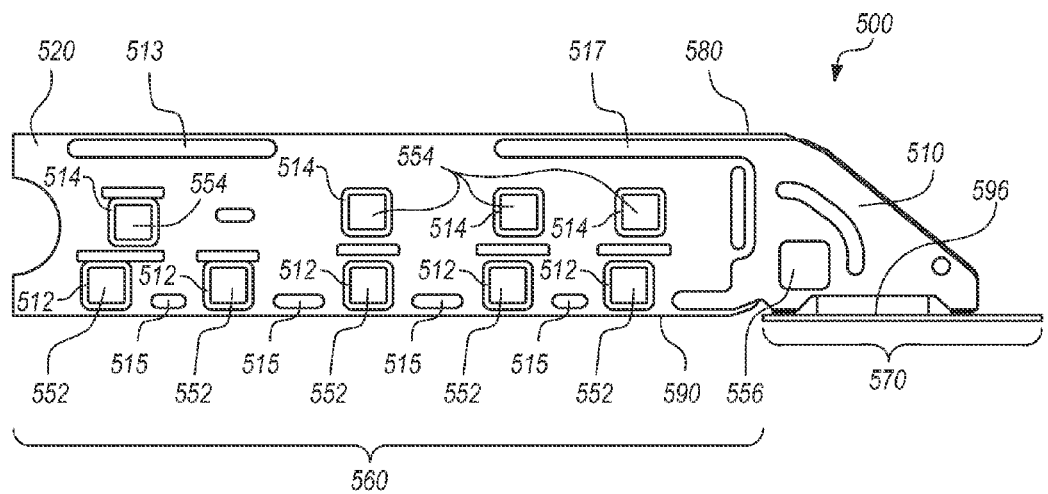
FIG. 5B depicts a plan view of the flexure tail terminal region of FIG. 5A, facing the structural layer side.

FIG. 5A depicts a plan view of a flexure tail terminal region 500 according to an embodiment of the present invention, facing the side that includes its conductive layer 530. FIG. 5B depicts a plan view of the flexure tail terminal region 500, facing the side that includes its structural layer 510. The flexure tail terminal region 500 is preferably configured to at least partially overlap a FPC (e.g. FPC 260 of FIG. 2) in a bonding area 560, but not in an adjacent area 570. In the embodiment of FIGS. 5A and 5B, the adjacent area 570 of the flexure tail terminal region 500 includes a bent portion 596 extending approximately normally from a major plane of the flexure tail terminal region 500.

In the embodiment of FIGS. 5A and 5B, the flexure tail terminal region 500 includes a structural layer 510 (e.g. stainless steel), a conductive layer 530 (e.g. copper), and a dielectric layer 520 (e.g. polyimide) between the structural layer 510 and the conductive layer 530. The flexure tail terminal region 500 may also include an optional cover layer 540 that comprises an electrically insulative material (e.g. an insulative polymer).

In the embodiment of FIGS. 5A and 5B, the flexure tail terminal region 500 is bounded by two opposing longitudinal outer edges 580, 590. The flexure tail terminal region 500 includes a plurality of flexure bond pads 532, 534 that are aligned with corresponding ones of a plurality of FPC bond pads (e.g. FPC bond pads 380 of FIG. 3). The dielectric layer 520 may optionally include a plurality of through openings 522, for example to control the spread of ACF material used to make electrical connections to the flexure bond pads 532, 534.

In the embodiment of FIGS. 5A and 5B, each of the plurality of flexure bond pads 532, 534 comprises a corresponding one of a plurality of widened regions of a plurality of electrical traces 538 in the conductive layer 530. The flexure tail terminal region 500 further includes a plurality of discontinuous bond pad backing islands 512, 514 in the structural layer 510. Note that each of the discontinuous backing islands 512, 514 in the structural layer 510 overlaps and is aligned with a corresponding one of the flexure bond pads 532, 534 in the conductive layer 530. The structural layer islands 512, 514 may serve to transfer heat and pressure from a flat thermode tool to the plurality of flexure bond pads 532, 534 (simultaneously) during the HSA assembly process, for example to facilitate ACF bonding.

In the embodiment of FIGS. 5A and 5B, the flexure tail terminal region 500 also optionally includes a plurality of discontinuous edge stiffener islands 513, 515 in the structural layer 510 that do not overlap any of the flexure bond pads 532, 534. In the embodiment of FIGS. 5A and 5B, the flexure tail terminal region 500 further comprises a narrow peninsula 517 in the structural layer 510 that is contiguous with the structural layer 510 in the flexure tail as it runs outside of the flexure tail terminal region (e.g. contiguous with the structural layer that runs along the actuator arm 238 in flexure tail 274 of FIG. 2).

Now referring to FIGS. 3, 5A and 5B, in certain embodiments the FPC 260 preferably may be designed so that the FPC conductive traces 382 are not disposed in locations that would overlap with the discontinuous edge stiffener island 513 or the narrow peninsula 517. Otherwise, such locations may be subject to undesirably high pressure from a thermode tool during the process of bonding the flexure tail terminal region 500 to the FPC 260, which may undesirably reduce the pressure or uniformity of pressure applied to the flexure bond pads by the thermode tool during head stack assembly.

In the embodiment of FIG. 5B, a noble metal layer comprising testing pads 552, 554 is disposed on the plurality of backing islands 512, 514 in the structural layer 510. The noble metal layer also optionally includes a grounding pad 556 deposited on the structural layer 510 in the adjacent area 570. The noble metal layer preferably comprises ruthenium, rhodium, palladium, silver, osmium, iridium, platinum, or gold, or an alloy thereof, having a noble metal thickness that is preferably but not necessarily in the range of 0.2 microns to 4 microns. Note that the adjacent area 570 does not include the plurality of backing islands 512, 514 of the structural layer 510.

In certain embodiments, the noble metal testing pads 552, 554 may advantageously facilitate reliable temporary electrical contact to the backing islands 512, 514 of the structural layer 510, by electrically conductive testing probes of an electrical tester (e.g. a DET tester). In certain embodiments, each of the plurality of backing islands 512, 514 of the structural layer 510 is itself electrically connected to a corresponding one of the plurality of flexure bond pads 532, 534 by a conductive via through the dielectric layer 520. In such embodiments, the temporary electrical contact made by the testing probes to the backing islands 512, 514 of the structural layer 510, may provide the electrical tester with further electrical conduction to the flexure bond pads 532, 534 and then to the electrical traces 538. Moreover, the grounding pad 556 of the noble metal layer may enhance the reliability of a temporary ground connection made during such testing.

In the foregoing specification, the invention is described with reference to specific exemplary embodiments, but those skilled in the art will recognize that the invention is not limited to those. It is contemplated that various features and aspects of the invention may be used individually or jointly and possibly in a different environment or application. The specification and drawings are, accordingly, to be regarded as illustrative and exemplary rather than restrictive. For example, the word "preferably," and the phrase "preferably but not necessarily," are used synonymously herein to consistently include the meaning of "not necessarily" or optionally. "Comprising," "including," and "having," are intended to be open-ended terms.

What is claimed is:

1. A head suspension assembly comprising:
   a load beam; and
   a laminated flexure that comprises a stainless steel layer, a copper trace layer, and a dielectric layer between the stainless steel layer and the copper trace layer, the laminated flexure including a flexure tail that extends away from the load beam to a flexure tail terminal region;
   wherein the copper trace layer includes a plurality of flexure bond pads in the flexure tail terminal region;
   wherein the stainless steel layer includes a plurality of backing islands in the flexure tail terminal region, each of the plurality of backing islands being aligned with a corresponding one of the plurality of flexure bond pads;
   wherein a noble metal layer is disposed on the plurality of backing islands; and
   wherein each of the plurality of backing islands is electrically connected to the corresponding one of the plurality of flexure bond pads by a conductive via through the dielectric layer.

2. A head suspension assembly comprising:
   a load beam; and
   a laminated flexure that comprises a stainless steel layer, a copper trace layer, and a dielectric layer between the stainless steel layer and the copper trace layer, the laminated flexure including a flexure tail that extends away from the load beam to a flexure tail terminal region;
   wherein the copper trace layer includes a plurality of flexure bond pads in the flexure tail terminal region;
   wherein the stainless steel layer includes a plurality of backing islands in the flexure tail terminal region, each of the plurality of backing islands being aligned with a corresponding one of the plurality of flexure bond pads;
   wherein a noble metal layer is disposed on the plurality of backing islands; and
   wherein the noble metal layer includes a plurality of testing pads, each of the plurality of testing pads being disposed on one of the plurality of backing islands.

3. The head suspension assembly of claim 2 wherein the noble metal layer further includes a grounding pad that is disposed on the stainless steel layer in an adjacent area of the flexure tail terminal region that does not include the plurality of backing islands.

4. A head suspension assembly comprising:
   a load beam; and
   a laminated flexure that comprises a stainless steel layer, a copper trace layer, and a dielectric layer between the stainless steel layer and the copper trace layer, the laminated flexure including a flexure tail that extends away from the load beam to a flexure tail terminal region;
   wherein the copper trace layer includes a plurality of flexure bond pads in the flexure tail terminal region;
   wherein the stainless steel layer includes a plurality of backing islands in the flexure tail terminal region, each of the plurality of backing islands being aligned with a corresponding one of the plurality of flexure bond pads; and
   wherein a noble metal layer is disposed directly in contact with the plurality of backing islands.

5. The head suspension assembly of claim 4 wherein the noble metal layer comprises gold.

6. The head suspension assembly of claim 4 wherein the noble metal layer has a noble metal thickness in the range of 0.2 microns to 4 microns.

7. A disk drive comprising:
   a disk drive base;
   a disk rotatably mounted to the disk drive base;
   an actuator pivotably mounted to the disk drive base, the actuator including at least one actuator arm and a flexible printed circuit (FPC) that includes a plurality of electrically conductive FPC bond pads; and
   at least one head gimbal assembly attached to the at least one actuator arm, the at least one head gimbal assembly comprising
      a head for reading data on the disk; and
      a suspension assembly that comprises
         a load beam; and
         a laminated flexure that comprises a metal structural layer, a metal conductive trace layer, and a dielectric layer between the metal structural layer and the metal conductive trace layer, the laminated flexure including a tongue portion that connects to the read head and a flexure tail that extends to the plurality of FPC bond pads, the flexure tail including a flexure tail terminal region that at least partially overlaps the FPC;
         wherein the metal conductive trace layer includes a plurality of flexure bond pads in the flexure tail terminal region, each of the plurality of flexure bond pads being aligned with and bonded to a corresponding one of the plurality of FPC bond pads;
         wherein the metal structural layer includes a plurality of backing islands in the flexure tail terminal region, each of the plurality of backing islands aligned with a corresponding one of the plurality of flexure bond pads; and
         wherein a noble metal layer is disposed directly in contact with the plurality of backing islands.

8. The disk drive of claim 7 wherein the noble metal layer comprises gold.

9. The disk drive of claim 7 wherein the structural layer comprises stainless steel, the dielectric layer comprises polyimide, and the conductive layer comprises copper.

10. The disk drive of claim 7 wherein the noble metal layer has a noble metal thickness in the range of 0.2 microns to 4 microns.

11. A disk drive comprising:
a disk drive base;
a disk rotatably mounted to the disk drive base;
an actuator pivotably mounted to the disk drive base, the actuator including at least one actuator arm and a flexible printed circuit (FPC) that includes a plurality of electrically conductive FPC bond pads; and
at least one head gimbal assembly attached to the at least one actuator arm, the at least one head gimbal assembly comprising
a head for reading data on the disk; and
a suspension assembly that comprises
a load beam; and
a laminated flexure that comprises a metal structural layer, a metal conductive trace layer, and a dielectric layer between the metal structural layer and the metal conductive trace layer, the laminated flexure including a tongue portion that connects to the read head and a flexure tail that extends to the plurality of FPC bond pads, the flexure tail including a flexure tail terminal region that at least partially overlaps the FPC;
wherein the metal conductive trace layer includes a plurality of flexure bond pads in the flexure tail terminal region, each of the plurality of flexure bond pads being aligned with and bonded to a corresponding one of the plurality of FPC bond pads;
wherein the metal structural layer includes a plurality of backing islands in the flexure tail terminal region, each of the plurality of backing islands aligned with a corresponding one of the plurality of flexure bond pads;
wherein a noble metal layer is disposed on the plurality of backing islands; and
wherein the noble metal layer includes a plurality of testing pads, each of the plurality of testing pads being disposed on one of the plurality of backing islands.

12. The disk drive of claim 11 wherein the noble metal layer further includes a grounding pad that is disposed on the metal structural layer in an adjacent area of the flexure tail terminal region that does not overlap with the FPC and that does not include the plurality of backing islands.

13. A disk drive comprising:
a disk drive base;
a disk rotatably mounted to the disk drive base;
an actuator pivotably mounted to the disk drive base, the actuator including at least one actuator arm and a flexible printed circuit (FPC) that includes a plurality of electrically conductive FPC bond pads; and
at least one head gimbal assembly attached to the at least one actuator arm, the at least one head gimbal assembly comprising
a head for reading data on the disk; and
a suspension assembly that comprises
a load beam; and
a laminated flexure that comprises a metal structural layer, a metal conductive trace layer, and a dielectric layer between the metal structural layer and the metal conductive trace layer, the laminated flexure including a tongue portion that connects to the read head and a flexure tail that extends to the plurality of FPC bond pads, the flexure tail including a flexure tail terminal region that at least partially overlaps the FPC;
wherein the metal conductive trace layer includes a plurality of flexure bond pads in the flexure tail terminal region, each of the plurality of flexure bond pads being aligned with and bonded to a corresponding one of the plurality of FPC bond pads;
wherein the metal structural layer includes a plurality of backing islands in the flexure tail terminal region, each of the plurality of backing islands aligned with a corresponding one of the plurality of flexure bond pads;
wherein a noble metal layer is disposed on the plurality of backing islands; and
wherein each of the plurality of backing islands is electrically connected to the corresponding one of the plurality of flexure bond pads by a conductive via through the dielectric layer.

* * * * *